(12) United States Patent
Büstgens

(10) Patent No.: US 12,161,048 B2
(45) Date of Patent: Dec. 3, 2024

(54) PIEZO ACTUATOR AND PIEZO ACTUATOR ARRAY

(71) Applicant: EXEL Industries SA, Epernay (FR)

(72) Inventor: Burkhard Büstgens, Gundelfingen (DE)

(73) Assignee: EXEL Industries SA, Epernay (FR)

( * ) Notice: Subject to any disclaimer, the term of this patent is extended or adjusted under 35 U.S.C. 154(b) by 825 days.

(21) Appl. No.: 17/232,800

(22) Filed: Apr. 16, 2021

(65) Prior Publication Data

US 2021/0328128 A1   Oct. 21, 2021

(30) Foreign Application Priority Data

Apr. 21, 2020   (DE) ..................... 10 2020 002 403.3

(51) Int. Cl.

| | |
|---|---|
| H01L 41/02 | (2006.01) |
| H10N 30/01 | (2023.01) |
| H10N 30/20 | (2023.01) |
| H10N 30/88 | (2023.01) |
| F16K 99/00 | (2006.01) |

(52) U.S. Cl.
CPC ............ H10N 30/20 (2023.02); H10N 30/01 (2023.02); H10N 30/88 (2023.02); *F16K 99/0048* (2013.01)

(58) Field of Classification Search
CPC ............................... H10N 30/20; H10N 30/88
USPC .......................................................... 310/328
See application file for complete search history.

(56) References Cited

U.S. PATENT DOCUMENTS

2002/0153807 A1 * 10/2002 Schwartz ............. H10N 30/204
                                                                310/328

FOREIGN PATENT DOCUMENTS

DE        102009033780    *   1/2011   ........... F16K 31/006

* cited by examiner

*Primary Examiner* — Derek J Rosenau
(74) *Attorney, Agent, or Firm* — Lott & Fischer, PL

(57) ABSTRACT

A piezo actuator for carrying out an actuating movement is disclosed, with a piezo bending transducer made of a carrier layer which is at least partially covered on one or two sides with a piezo lamella, with a movable end and with a housing, with a reference stop connected to the housing for determining a reference position for the actuating movement, with a first bearing region which comprises regions of the piezo actuator and the housing and which allows for twists $\phi 1$ of the piezo bending transducer, with a second bearing region having a surface on the side of the bending transducer and a surface on the side of the housing, and an intermediate layer between the surfaces, which connects them and which can be liquefied, and with a pressure element for generating a bias torque on the piezo bending transducer around the first bearing region against the reference stop.

15 Claims, 4 Drawing Sheets

This application is being filed as a non-provisional patent application under 35 U.S.C. § 111 (a) and 37 CFR § 1.53 (b). This application claims priority under 35 U.S.C. § 119 (a) to German patent application number 10 2020 002 403.3 filed on Apr. 21, 2020, the contents of which are incorporated herein by reference.

FIELD OF INVENTION

The invention relates to individual piezo bending transducers and array arrangements of piezo bending transducers, so-called piezo bending transducer arrays and their applications, in particular microvalves and microvalve arrays.

BACKGROUND OF THE INVENTION

Piezo bending transducer arrays according to the invention are used in particular for actuating microfluidic valve arrays in multi-channel print heads or coating heads with one or more rows of dispensing nozzles which are controllable individually or in groups and which dispense liquid drops or liquid jets on surfaces for the purpose of colored decoration or for the sharply contoured, spray-free, digitally controlled application of one or more layers of a liquid coating agent such as paint, varnish, adhesive or sealant, or for functional coatings of components.

Corresponding print heads can potentially be used in the field of painting, sealing or gluing vehicles of all types, such as motor vehicles, but also aircraft and ships, primarily with the use of industrial robots (in particular multi-axis buckling arm robots) for moving the print heads or coating heads, or in the field of coating components of any kind, including products from the consumer goods industry, with liquid coating agents, using industrial robots or Cartesian robots, or integrated into single-pass printing or coating systems, and in the field of all coatings required in connection with buildings.

In particular, the aforementioned microvalve arrays are used as micropneumatic pilot valve arrays in print heads or coating heads of the type described above which work according to an electro-pneumatic operating principle, as described, for example, in EP 2 442 983 B1. The components described herein assume the functions of the components of the micropneumatic circuit and the actuators described in EP 2 442 983 B1.

Piezo bending transducers from the prior art addressed herein (cf., for example, FIG. 1) are mostly actuators of a specific length firmly clamped on one side for generating an actuating movement perpendicular to the longitudinal direction at a movable end and are predominantly flat and constructed of a plurality of material layers with at least one piezoelectric layer. The longitudinal expansion resulting from the application of electrical voltage to one or more piezoelectric layers results in a bending of the bending transducer perpendicular to the longitudinal direction as a result of the internal tension of the multilayer structure, with a significantly greater deflection compared to the longitudinal expansion. This is used for actuating tasks in that the piezo bending transducer either moves an actuating element, for example, a microvalve, directly at its first, movable end or via an effector. The deflection of the piezo bending transducer increases with its length; the natural frequency of the first eigenmode used for actuating tasks and thus the force and rigidity decrease. The objective of the design of a piezo bending transducer is usually that the deflection, force and the first natural frequency are as high as possible. Piezo bending transducers addressed herein are designed for a stroke of the order of 20 μm [micrometers], 50 μm, 100 μm, 200 μm or higher with a distance between adjacent piezo bending transducers from 0.5 mm [millimeters] to, for example, 10 mm and more.

An always unchangeable reference position of the movable end of the piezo bending transducer or of an effector connected thereto with respect to the actuating element of the microvalve is essential for a defined operation. The actuating element of a microvalve is the movable element of a valve, for example, a closing element which corresponds to a valve opening, and thus forming a "valve" in that the valve opening is either closed or opened depending on the position of the actuating element. Due to the aforementioned small deflections in connection with microvalves, undesirable changes, such as mechanical expansions, deformation or creep processes which can occur over time or are temperature-related, in the piezo bending transducer or in its periphery including the housing, affect the reference position, i.e., the distance between the effector and the actuating element of the microvalve. A changed reference position changes the function of the microvalve. Conventional piezo bending transducers are firmly clamped on one side, as shown, for example, in FIG. 1A, so that these changes cannot be compensated in the long term.

As a solution, DE 10 2009 033 780 B4 proposes a piezo bending transducer for a pneumatic valve with a "floating bearing" or fluid bearing. Together with a bias torque applied by a spring, which presses the piezo bending transducer against a reference position, the fluid bearing offers no resistance in the static case, so that slowly occurring changes are continuously compensated. However, by using a highly viscous bearing fluid, rapid actuating movements encounter fluid resistance, so that the fluid bearing, in relation to said actuating movements, acts like a fixed bearing. However, the disadvantage of using a fluid bearing is that operation with static deflections is not possible; it is only suitable for pulse operation.

In addition to the desire for an actuating function that remains unchanged over the entire service life under the aforementioned harmful influences, there is, for the aforementioned applications, also a fundamental desire for high operating frequencies in the range of, for example, 500 Hz [hertz], 1 kHz, 2 kHz, 3 kHz, 4 kHz, or 5 kHz, high bending transducer deflection, high holding force, low electrical operating voltage, small differences between adjacent piezo bending transducers and as unlimited a service life as possible and inexpensive mass production of the piezo bending transducer arrays and microvalve arrays.

Overall, the problem addressed by the invention is that of creating high-performance piezo bending transducers of an actuator array for a long service life, in particular for the applications mentioned.

This problem is solved by a piezo actuator having the features of the independent claim having a piezo bending transducer and a piezo bending transducer array composed of at least one row of piezo bending transducers.

SUMMARY OF THE INVENTION

The piezo actuator according to the invention and the piezo actuator array composed thereof, including the disclosed embodiments, allow for a continuous long-term operation.

According to an also claimed method for aligning a piezo actuator, automated alignment processes of the piezo actuator with respect to the actuator are carried out repeatedly in order to be able to actuate actuating elements such as closing elements of microvalves in an always reproducible manner. In an alignment process, the piezo actuator is in this case always brought back to its reference or starting position relative to the actuating element to eliminate the aforementioned undesired changes in the piezo elements, actuating elements, microvalves, or in the region of the housing, and this state is frozen until the next alignment process. In an alignment process, an intermediate layer is briefly melted in a bearing region of the piezo bending transducer and the piezo elements are put into a defined charge state. By means of an external force on the piezo bending transducer, it is moved with its movable end or an effector connected thereto against a reference stop, for example, the closing element of a microvalve. This state is subsequently frozen by solidification of the intermediate layer and the piezo actuator is again in its reference position.

It should be noted that an alignment process according to the invention can be used in many ways: for example, for the first time during the installation and/or start-up of a component, in particular a print head, coating head, dosing head, dispensing head, a liquid valve, or a pneumatic valve, to name but a few; also in maintenance, when modifying the component for a new application, when changing or replacing peripheral components, and when changing the operating conditions of an existing configuration, for example, by adapting it to a changed application or specification; in particular in the case of a print head or coating head, when adapting it to a different or changed coating agent or to changed operating parameters (temperature, pressures . . . ), coating parameters (layer thickness, application speed, drop frequency, changing between drop and jet application); furthermore, after changing the position of the reference stop or when the charge state of the piezo elements of the piezo actuator associated with the reference stop is to be changed. In summary, the alignment process according to the invention can be used in every situation if the piezo actuator should be referenced with regard to new or changed conditions of any kind.

In order to make the aforementioned alignment processes possible, a piezo actuator according to the invention, which is used to carry out an actuating movement, has the necessary devices and means: For this purpose, the piezo actuator first has a piezo bending transducer made of a carrier layer that is at least partially covered on one or two sides with a piezo lamella, furthermore a movable end for carrying out an actuating movement, and a housing in which the piezo bending transducer is mounted and an actuating element or an actuating application, such as a microvalve, firmly connected thereto. The piezo actuator according to the invention is further characterized by a reference stop connected to the housing for determining a reference position for the actuating movement of the actuating element or the actuating application, furthermore by a first bearing region which includes regions of the actuator and the housing and which makes twists $\phi 1$ of the piezo bending transducer possible, furthermore by a second bearing region with a surface on the side of the bending transducer and a surface on the side of the housing, and an intermediate layer between the surfaces, which connects said surfaces and which can be liquefied (at a low temperature), and finally by a pressure element for generating a bias torque onto the piezo bending transducer around the first bearing region against the reference stop.

The piezo actuator according to the invention with piezo bending transducer and the corresponding piezo bending transducer array thus initially have a carrier layer in accordance with the prior art from DE 10 2009 033 780 B4, which, on one side ("monomorphic") or both sides ("bimorphic"), is covered with a piezo lamella which at least partially covers/cover the carrier layer. The piezo lamellas also have the usual metallizations made, for example, from a silver-containing thick layer or a thin film structure. Furthermore, the piezo bending transducer (and correspondingly the piezo bending transducer array) has a movable end for carrying out an actuating movement, furthermore a reference stop for determining a reference position for the actuating movement which is associated with the movable end of the piezo bending transducer, and additionally a first bearing region which is designed such that the piezo bending transducer can be rotated about it. It also has a second bearing region which contains an intermediate layer between a surface on the side of the bending transducer and a surface on the side of the housing, furthermore a pressure element in the region of the first bearing region for generating a constant bias torque onto the piezo bending transducer around the first bearing region, which is oriented such that the movable end of the piezo bending transducer or an effector connected thereto presses against the actuator or a reference stop associated with the microvalve.

In contrast to DE 10 2009 033 780 B4, the intermediate layer in the second bearing region consists of a solid which, however, can be temporarily fused (is fusible) thereto. In one operating mode, the intermediate layer in the second bearing region is in a solid aggregate state and, in different preferred variants, acts either predominantly like a fixed bearing or predominantly like a rotatable bearing, thus like a bearing that, with regard to one or more translational degrees of freedom, is fixed at least in the direction of the actuating movement of the piezo bending transducer. In contrast to DE 10 2009 033 780 B4, the piezo bending transducer thus also allows for stationary deflections during operation.

In a first bearing type LA1, the second bearing region, which always contains the intermediate layer, supports the piezo bending transducer in a larger region, so that this bearing region preferably acts firmly in all six degrees of freedom of movement, see FIG. 1. In a second bearing type LA2; the second bearing region is narrowly delimited or designed point-wise and is located at the end of the piezo bending transducer opposite the movable end of the piezo bending transducer, see FIG. 2A-2C.

The piezo bending transducer is now further characterized by an operating mode and an alignment mode, wherein the piezo bending transducer carries out actuating movements in the operating mode, the temperature of the intermediate layer is below its liquefaction temperature and the intermediate layer is sufficiently firm to transfer the bearing forces in the second bearing region, and wherein, in the alignment mode, the piezo bending transducer is aligned with a reference stop in that the temperature of the intermediate layer is above its liquefaction temperature due to a supply of heat.

In the alignment mode, one or more alignment processes are carried out which contain the following steps: in interchangeable order, the liquefaction of the intermediate layer of the second bearing region by heating it with a heat source, or the application of those electrical voltages to all electrical electrodes of the piezo bending transducer which should be associated with the position of the reference stop; in a subsequent step, the alignment of the piezo bending transducer against the reference stop under the effect of the bias torque for the duration of an alignment time TA, and finally the solidification of the intermediate layer by cooling the second bearing region during the duration of a cooling time TK. Therefore, in the step of solidifying the material of the intermediate layer, the position of the surface on the side of the bending transducer and the surface on the side of the housing of the second bearing region relative to one another is frozen at the time of solidification.

It should be noted that before the step of solidifying the intermediate layer for an alignment time TA in the range of, for example, ½ s [second], 1 s, 5 s, 10 s, 30 s, or 1 minute, the intermediate layer must simultaneously be present in a flowable state and a defined electrical voltage must be applied to all electrodes of the piezo bending transducer.

During the alignment time TA, the piezo bending transducer then rotates about the first bearing region in a positive or negative rotational direction if there was a deviation in the position of the piezo bending transducer in relation to its alignment with respect to the reference stop before the alignment process. During the alignment of the piezo bending transducer in an alignment process, the position of the surface on the side of the bending transducer changes relative to the fixed surface of the second bearing region associated with the housing and liquefied material can flow in or out of the intermediate layer into the gap between the surfaces. Finally, the position of the two surfaces relative to one another is frozen during solidification and the piezo bending transducer is in its reference alignment.

An alignment process can be carried out as a one-time process during the initial assembly of the piezo bending transducer in order to bring it into a reference alignment or the reference position for the first time. In this case, the heat of fusion required for melting the intermediate layer can be supplied, for example, by hot air or by a soldering tip.

Furthermore, alignment processes can be carried out several times or at regular intervals, for example, in an annual, monthly, weekly, daily or hourly cycle, over the service life of the print head or coating head. By regularly carrying out alignment processes, a piezo bending transducer and thus all piezo bending transducers of a piezo bending transducer array can always be operated precisely in its reference alignment for many years.

In addition to the long-term stability thus obtained, multi-channel print or coating heads, which are based on the piezo actuators and comprise one or more of them, show only minimal differences between the individual channels after completion and after the initial alignment process.

In this context, it is also proposed to continuously detect deviations in the print image as part of quality assurance during a printing or coating operation or by means of test printouts or test coatings, which may indicate differences between the channels of the print or coating head, and to carry out one or more timely alignment processes. For example, specific adjustments to printing or coating processes can be made by enlarging or reducing the actuating regions or by moving the actuating regions of the piezo actuators. In this context, it is particularly advisable to carry out the alignment process under changed electrical charge states, i.e., by applying changed electrical voltages to the electrodes of the piezo bending transducer, in comparison to the alignment process carried out most recently.

It is therefore proposed that a corresponding sequence for adjusting a print head or coating head to an application or for carrying out a quality-improving measure contains the following steps at least once:
 a) carrying out a drop or jet ejection from the nozzles and/or making a test printout or carrying out a test coating by means of the print head or coating head;
 b) the metrological, optical or visual detection and qualification of the test printout or the test coating, for example, by measuring the layer thicknesses, the contour sharpness, the gloss level, the layer evenness and the detection of splashes or satellite drops or by optical inspection of the dynamic drop delivery including the jet or drop speeds, processes of decay and the detection of deposits of coating agents on the print heads, in particular on the nozzle outlets;
 c) carrying out an alignment process, wherein the electrical voltages applied to the electrodes of the piezo bending transducer differ from those of the last alignment process or the position of the reference stop has changed compared to that of the last alignment process.

It should be noted that this can be viewed overall as an iterative process, wherein it is preferred to carry out an alignment process according to c) even before the first step according to a) and to end the iterative process ultimately after a step b) if it has produced satisfactory results.

If repeated alignment processes are provided, one or more heating elements are preferably already firmly integrated into the aforementioned print heads or coating heads, which are preferably connected to the housing and are in thermal contact with the surface of the second bearing region assigned to the housing. In this case, the heating elements and the electrical voltages to be applied to the electrodes of the piezo bending transducers can be controlled via a process controller. This can optionally be the same process controller that carries out the entire control of the printing or coating processes, or it can be subordinate to said process controller. It should only be noted hereto that such a control can take place by simply specifying a heat output and a duration or (preferably) by means of a temperature control, preferably based on the measurement of the actual temperature close to the second bearing region by means of a temperature sensor.

The heat output emitted by the heating element is preferably controlled by the process controller such that the temperature in the second bearing region is raised above the melting temperature of the intermediate layer and the intermediate layer is melted for a period of time in the order of magnitude of 1 second, 10 seconds or 100 seconds.

It must be mentioned hereto that an initial alignment process is carried out during the initial assembly of a print head or coating head or a component that contains one or more piezo actuators according to the invention. In this case, the intermediate layer can also be liquefied in the alignment mode with an integrated heating element which is in thermal contact with the second bearing region. Alternatively, however, the intermediate layer can also be liquefied by an external heat source such as hot air or by means of a soldering iron which is brought into contact with the material of the intermediate layer or with one of the surfaces adjacent thereto.

For example, the intermediate layer can preferably consist of a solder with a melting temperature below 150° C. [degrees Celsius], 200° C., or 250° C. It can simultaneously be used to make electrical contact either with the carrier layer of the piezo bending transducer or with an electrode of a piezo lamella. Another option is that the intermediate layer consists of a hot-melt adhesive, thermoplastic material, a thermoplastic elastomer (TPE), a bitumen, or a wax, the melting temperature of which is below 100° C., 150° C., 200° C., or 250° C. It should be noted hereto that the maximum temperature of the piezo lamellas of the piezo bending transducer caused by the heating should remain sufficiently below the Curie temperature of the piezo material. Therefore, all materials with a sufficiently low melting point are generally preferred for use as the intermediate layer because they make it possible to melt the material of the intermediate layer without the resulting maximum temperature of the piezo lamella approaching the Curie temperature of the piezo material. The use of a solder or thermoplastic material as the intermediate layer mainly leads to a firm connection and eliminates a twisting tolerance directly at the connection point. In this case, the required elasticities within the individual bearing regions must be added separately. In the case of a thermoplastic elastomer w(TPU, TPE), a rotation tolerance of the corresponding second bearing region can already be achieved due to the elasticity of the material.

The alignment of the piezo bending transducer against the reference stop takes place under the effect of a bias torque for the duration of an alignment time TA. The piezo actuator according to the invention therefore has means for applying a bias torque to the piezo bending transducer around the first bearing region, wherein the bias torque is applied such that the movable end of the piezo bending transducer or an effector connected thereto is pressed against a reference stop.

The bias torque is applied by exerting a defined force F on the piezo bending transducer by means of a pressure element, wherein the contact point of the pressure element with the piezo bending transducer is offset along the piezo bending transducer by a lateral offset x from the pivot point of the first bearing region. For the level of the force F and the offset x on the basis of the clamping force $F_K$ of the piezo bending transducer and the distance $L_R$ of the first bearing region to the actuation point of the piezo bending transducer, the following relationship applies: $F*x<0.5*F_K*L_R$. The structural implementation of this application of force will be addressed using the embodiments according to the figures.

It should be mentioned that a corresponding piezo bending transducer 2 of a piezo actuator according to the invention can be constructed monomorphically with only a single piezo lamella 3 which is glued to a carrier layer 4, or it can be constructed bimorphically with two piezo lamellas 3 which are glued to the carrier layer 4 on both sides, wherein the one or two piezo lamellas 3 cover the carrier layer (4), for example, predominantly in the region of a free length L1 of the piezo bending transducer, or the one or two piezo lamellas 3 cover the carrier layer 4 essentially completely.

In addition to the measures described above for securing, adapting or restoring constant operating conditions of piezo actuators, a second bearing type LA2 of the piezo bending transducer in the piezo actuator according to the invention furthermore achieves a greatly improved performance of the piezo bending transducer when compared to the prior art. This opens up access to applications with higher performance requirements and/or higher power density. Conversely, with an unchanged application with unchanged actuation work, a reduction in the control voltages and thus a significant reduction in the electrical voltage load and the mechanical tension load on the piezo elements can be made, which can significantly improve their long-term strength up to a level of fatigue strength. A reduction in the width of the piezo bending transducer and thus, in the case of a print head or coating head, a reduction in the channel width or the distance between the dispensing nozzles or an improvement in the print resolution can also be made with the actuation performance per individual actuator or per pressure channel unchanged when compared to the prior art.

In a preferred embodiment, a piezo actuator is characterized by an actuation point at its movable end or by an effector connected thereto for carrying out an actuating movement, furthermore by a centrally located, narrowly delimited bearing region which comprises regions of the actuator and the housing, and also by a laterally located, narrowly delimited bearing region at the opposite end of the movable end, which also comprises regions of the actuator and the housing, wherein the centrally located bearing region and the laterally located bearing region contain elasticities that each allow for local rotations of the piezo bending transducer of at least +/−2° [degrees]. In this case, the centrally located bearing region is preferably located within the middle third of the piezo bending transducer.

For clarifying the nomenclature, it should be noted that the previously described bearing regions, the "first bearing region" and the "second bearing region," can each correspond to both the "centrally located bearing region" or the "laterally located bearing region." Therefore, the nomenclatures "first bearing region" and "second bearing region" are based on their function and design, while the nomenclatures "centrally located bearing region" and "laterally located bearing region" are based on their location.

In the second bearing type LA2, the centrally located bearing region is preferably arranged in the middle third of the piezo bending transducer, and the laterally located bearing region is arranged at the end of the piezo bending transducer opposite the movable end of the piezo bending transducer. Both are narrowly delimited or designed pointwise and designed such that they allow or tolerate the rotary movements of the piezo bending transducer, which result from the deformations of the piezo bending transducer, around said bearings without significant resistance. This bearing constellation results in a usable first eigenmode of the piezo bending transducer, which is shown, for example, in FIG. 3A. In comparison to the usually fixed clamping of a piezo bending transducer, as outlined in FIG. 1, this one is characterized in that, for a given bending radius R of the piezo bending transducer (same control voltage and deformation) and a given free length L1, a considerably larger actuating path (D2 in FIG. 3A instead of D1 in FIG. 1) is achieved in comparison to the fixedly clamped piezo bending transducer without its stiffness and thus the actuation force being reduced. The much higher or larger actuating path is due to the fact that the deformation curve of the piezo bending transducer is already twisted in the centrally arranged bearing region which increases the end deflection D2, see, for example, FIG. 3A. It should be mentioned hereto that, in the region of length L2, i.e., between the centrally located and the laterally located bearing region, the piezo bending transducer deflects in the opposite direction as in the region of the free length L1 which includes the movable end of the piezo bending transducer.

Furthermore, a piezo bending transducer thus mounted has a torque curve that is more uniform over its length than the usual fixed clamping as shown in FIG. 1, where a strong load maximum occurs on the clamping. This is a common cause of stress-related failures.

In order to make the eigenmodes of the piezo bending transducer shown in FIG. 3A possible, the centrally located bearing region (FIG. 3B) and the laterally located bearing region (FIG. 3C) must allow rotations of the piezo bending transducer in accordance with the deformation curve of the piezo bending transducer but firmly support the piezo bending transducer at least in the direction parallel to the actuating movement. For this purpose, different technical implementation options are proposed. For example, one option is the use of supports that are fixed relative to the housing and designed, for example, as fixed pointed or linear contact elements protruding from a housing attachment part, on which the piezo bending transducer rests and which can perform tilting movements out of the plane of the piezo lamellas. In this case, the piezo bending transducer must be pressed onto the support with sufficient pressure force to prevent the piezo bending transducer from being lifted, in particular in the case of higher actuating forces and/or highly dynamic operating modes. This pressure force is applied in the corresponding bearing region on the side of the piezo bending transducer opposite the support by means of movable spring-operated contact elements, such as metallic spiral springs, flexion springs, electrical contact springs, or elastomer elements.

In addition to the use of supports in combination with pressure elements, a point-wise, rotatable support of the piezo bending transducer can also be achieved in that the respective bearing region provides an essentially translational fixing. In order to obtain the rotary movements required according to the bending line of the piezo bending transducer in the centrally and laterally arranged bearing region, it is additionally proposed that these bearing regions contain elasticities that allow for rotary movements about a respective-possibly virtual-pivot point of the respective bearing region.

These can be, for example, elasticities of the piezo bending transducer within a respective bearing region, such as discrete elastic elements or structurally elastic regions of the carrier layer which are associated with the respective bearing region and locally not covered by piezo lamellas. This can be, for example, a region of the carrier layer that protrudes laterally (in the case of the laterally located bearing region) from the one or two piezo lamellas. The aforementioned elasticities can also be elastic intermediate layers made of elastomeric materials in the respective bearing regions. Furthermore, they can also be elasticities that are associated with the housing or further elastic or spring-like components connected thereto between the housing and the respective bearing region. These elasticities are configured such that they allow, at least to a small extent, a rotation of the piezo bending transducer locally in the region of the respective bearing region. Specific embodiments hereto will be described using the figures.

Regarding the size ratios, it should be noted that, depending on the application, the length L1 of the piezo bending transducer is, for example, between 4 mm and 6 mm, between 5 mm and 9 mm, or between 7 mm and 15 mm. The ratio of the lengths L1/L2 is preferably between 0.5 and 2. The at least one piezo lamella can cover the carrier layer predominantly in the region of the free length L1 or in the regions L1 and L2, i.e., on both sides of the respective central bearing region. The latter case is only meaningful for the LA2 bearing variant and results in the greatest deflections.

A corresponding piezo actuator array preferably consists of identical piezo actuators according to the invention with corresponding piezo bending transducers. Depending on the type of application, they are preferably at a constant distance from one another between 0.5 mm and 1 mm, between 0.75 mm and 2 mm, or between 1.5 mm and 5 mm. The width (B) of the gap between adjacent piezo bending transducers is preferably between 0.05 mm and 0.2 mm, between 0.1 mm and 0.3 mm, or between 0.2 mm and 0.6 mm. Furthermore, the first and second bearing regions or the centrally and laterally located bearing regions of the respective piezo bending transducers each lie on one line.

Furthermore, in a piezo actuator array, the contact points of the pressure elements, the pivot points of the respective bearing regions, and the actuation points of the individual piezo bending transducers each lie on one line.

Furthermore, a piezo actuator array preferably consists of a part which contains at least all piezo bending transducers and bearing regions, including the parts of the bearing region associated with the housing. The use of torsionally elastic connections between adjacent piezo bending transducers of the array, for example, at the respective first bearing regions, is advantageous for this purpose.

Furthermore, the above-described components associated with the housing of the respective first bearing regions, such as supports and pressure springs, and of the respective second bearing regions, preferably consist of a structured plate.

Definition: The term "bearing region" refers to all components in connection with a bearing between a point, a narrow or a wider region of the piezo bending transducer and a part of the housing 31 attributable to the bearing or components connected thereto which make an effective contribution to the behavior of the bearing, be it as a fixed bearing or as a rotary bearing. This is to take into account the fact that a rotary bearing is sometimes achieved by elasticities in the region of the bearing that are effective for this purpose.

As a precaution, it should be noted that the numerals used herein ("first," "second," . . . ) are primarily (only) used to distinguish between a plurality of similar objects, sizes or processes, i.e., in particular, they do not necessarily specify any dependency and/or sequence of said objects, sizes or processes with respect to one another. Should a dependency and/or sequence be required, it is explicitly stated herein or is obvious to a person skilled in the art when studying the specifically described embodiment.

In the following, the invention and the technical environment will be explained in more detail using the figures. It should be noted that the invention is not supposed to be limited by the depicted embodiments. In particular, unless explicitly stated otherwise, it is also possible to extract partial aspects from the facts described in the figures and to combine them with other components and insights from the present description and/or the figures. In particular, it must be noted that the figures and in particular the depicted size ratios are only schematic. Identical reference signs denote identical objects, so that explanations from other figures can be used in a supplementary manner, if necessary.

DETAILED DESCRIPTION OF THE INVENTION

Figure 1:
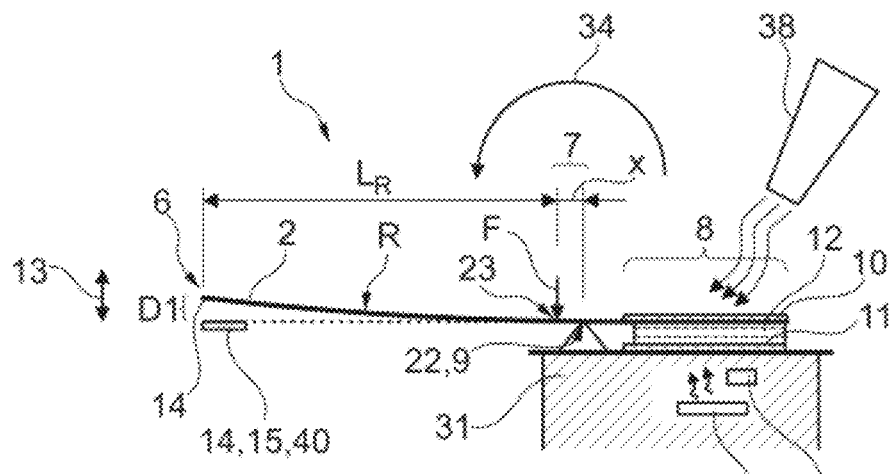
FIG. 1 shows a schematic diagram of a piezo actuator according to a first bearing type.

For purposes of clarity and ease of reference, following is a description of various components shown in the drawings and their corresponding reference designations:

1 Piezo actuator (piezo bending transducer 2+housing 31+optional effector 19)
2 Piezo bending transducer
3 Piezo lamellas
4 Carrier layer
5 Immovable end of the piezo bending transducer 2
6 Movable end of the piezo bending transducer 2
7 First bearing region of the piezo actuator 1,
8 Second bearing region of the piezo actuator 1
9 Support in the first bearing region 7
10 Surface of the second bearing region 8 on the side of the bending transducer
11 Surface of the second bearing region 8 on the side of the housing
12 Intermediate layer of the second bearing region 8
13 Actuating movement at the movable end 6 of the piezo bending transducer 2
14 Actuation point in contact with an actuating element
15 Reference stop
16 Centrally located bearing region
17 Laterally located bearing region
18 Connecting electrode
19 Effector
20 Elastic connection
21 Elastic region of the second bearing region
22 Pivot point of the first bearing region
23 Contact point of the pressure force
24 Pressure element, pressure spring array
25 Retaining bridge
26 Contact pad
27 Circuit board
28 Heating element
29 Through-connection
30 Bonding wire
31 Housing
32 Piezo actuator array
33 Process controller
34 Bias torque
37 Temperature sensor
38 External heat source
39 Insulating layer
40 Reference position
D1 Deflection, actuating path
D2 Deflection, actuating path
LR Distance between pivot point and actuation point
L1 Distance between the central bearing and the movable end of the piezo bending transducer, free region
L2 Distance between the central bearing and the lateral bearing
φ1 Twist
φ2 Twist
R Radius of curvature FIG. 1 shows a schematic diagram of a piezo actuator 1, consisting of a piezo bending transducer 2 in the state deflected by D1 at the movable end 6, wherein the movable end 6 in this case also represents the actuation point 14 which contacts any actuator, preferably the closing element of a microvalve. Also shown is a first bearing region 7, rotatable within certain limits of +/−5° [degrees], which is configured as a support 9 which represents the pivot point 22 of the first bearing region 7 and which is also connected to the housing 31. The distance between the pivot point 22 of the first bearing region 7 and the actuation point is LR. Also shown is a second bearing region 8, herein extended laterally along the piezo bending transducer, with an intermediate layer 12 made of a liquefiable or fusible material between a surface 10 of the second bearing region 8 on the side of the piezo bending transducer and a surface 11 on the side of the housing.

Due to its broad extension, the second bearing region 8 of this embodiment acts overall like a fixed clamping and with this property represents in this case a first bearing type (LA1). However, as shown, a bias torque 34 still acts permanently on the piezo bending transducer 2 around the first bearing region 7, caused by a downward force F which acts on the contact point 23 which is located offset from the pivot point 22 by a distance x along the bending transducer of the first bearing region 7. The bias torque 34 is dimensioned such that it represents a slight constant moment load on the piezo bending transducer 2, which is sufficient to rotate it in the case of a melted, i.e., force-free, intermediate layer 12 against a reference stop 15 which defines a reference position 40 of an actuating movement 13 of the piezo bending transducer 2. As described above, the intermediate layer 12 can be liquefied in an alignment mode by melting the intermediate layer 12. For example, it can be melted during installation by supplying heat from an external heat source 38 in the form of a supply of hot air or by using a soldering iron. As described above, the alignment process can also be carried out repeatedly with short interruptions during operation by using an integrated heating element 28 in interaction with a control device with optional temperature control by means of a temperature sensor 37. In this case, the heating element 28 and the temperature sensor 37 are connected, for example, to the housing 31 and are in close thermal contact with the second bearing region 8. Possible insulating layers 39 below the heating element, which prevent too large a portion of the heat from flowing into the housing 31, are not shown herein.

Figure 2A:
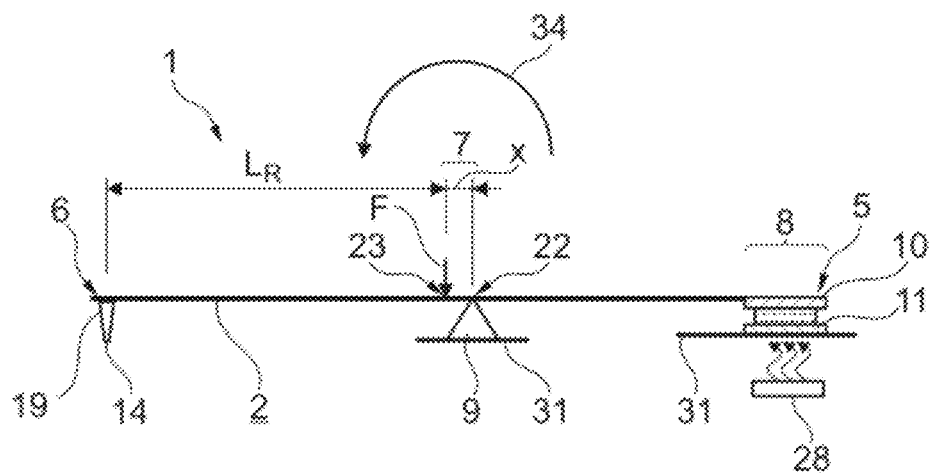
FIG. 2A shows a schematic diagram of a piezo actuator according to a second bearing type, wherein the first bearing region is located in the center of the piezo bending transducer and the second bearing region is located laterally at the immovable end and designed to be narrow.

FIG. 2A shows a schematic diagram of a piezo actuator 1 according to a second bearing type (LA2). In order to avoid repetitions, reference is made to the description of FIG. 1; in the following, only the differences will be addressed. The second bearing type differs from the first bearing type (LA1) as in FIG. 1 in that the second bearing region 8 is spatially narrowly delimited and is designed such that it can perform rotary movements to a small extent of, for example, up to +/−2° [degrees]. The replacement of the fixed bearing as in FIG. 1 of the second bearing region 8 by a rotary bearing leads to a different bending line of the piezo bending transducer 2 in contrast to FIG. 1, which allows for the realization of a piezo actuator 1 with a much higher actuation power. In FIGS. 1 and 2A, the first bearing region 7 corresponds to the centrally located bearing region 16 (cf. FIG. 3A, 3B) of the second bearing type, and the second bearing region 8, which contains the intermediate layer 12, corresponds to the laterally located bearing region 17 of the second bearing type LA2 (cf. FIG. 3A, 3C).

Figure 2B:
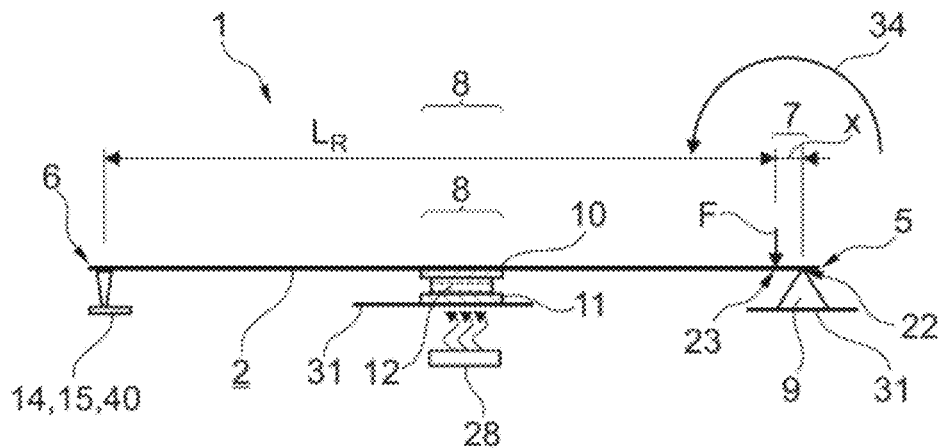
FIG. 2B shows a schematic diagram of a piezo actuator according to the second bearing type, wherein the second bearing region is located in the center and the first bearing region is located laterally at the immovable end of the piezo bending transducer.

FIG. 2B shows a second option of implementing the second bearing type LA2, which differs from the option shown in FIG. 2A in that the first bearing region 7 corresponds to the laterally located bearing region 17 of the second bearing type, and the second bearing region 8, which contains the intermediate layer 12, corresponds to the centrally located bearing region 16 of the second bearing type LA2. Once again, reference is made to the description of FIG. 1 and FIG. 2A in order to avoid repetitions. Only the differences will be addressed.

It should be mentioned that the sequence of the bearing regions as in FIG. 2B can also be transferred to the first bearing type LA1. However, the difference between the bearing types is once again that in the bearing type LA1, the second bearing region 8 is designed to be wide and as a fixed bearing.

Figure 3A:
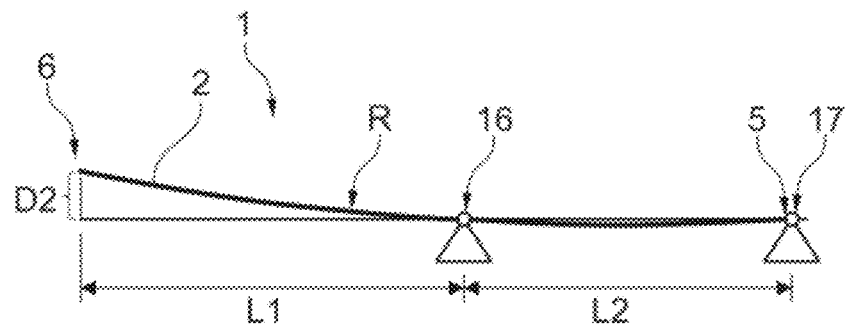
FIGS. 3A, 3B, and 3C show a schematic diagrams of piezo actuators according to the second bearing type with an enlarged depiction of particular eigenmodes of the deflected piezo bending transducers, including enlargements of the centrally located and laterally located bearing regions.

FIG. 3A shows the bending line of a piezo bending transducer 2 according to the second bearing type LA2. This represents the first eigenmode of the piezo bending transducer 2 under the marginal condition of a centrally located bearing 16 and a laterally located bearing 17, both of which being tolerant of the local rotational deformations of the piezo bending transducer 2. In this case, the entire length L1+L2 of the piezo bending transducer 2 is preferably covered with piezo lamellas on one side (monomorphically) or on both sides. In this context, L1 denotes a free length L1 of the piezo bending transducer 2, which specifies the freely movable length of the piezo bending transducer 2 between the central bearing 16 and the movable end 6. An immovable end 5 of the piezo bending transducer 2 is fixed on the laterally located bearing 17. In order to compare the difference in the actuating path at the movable end 6 with a piezo bending transducer 2 of the first bearing type LA1 as in FIG. 1, it is assumed that the piezo bending transducer 2 according to FIG. 1 is constructed identically in its free region L1 as the piezo actuator 1 from FIG. 3A. Therefore, both have a radius of curvature of R in the deflected state. It can be seen that, with the same radius of curvature, the resulting deflection D2 in the case of the second bearing type LA2 is considerably higher than in the case of the first bearing type LA1.

Figure 3B:
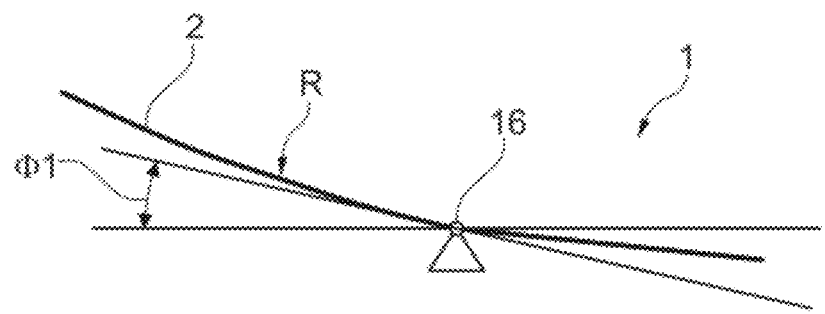
Figure 3C:
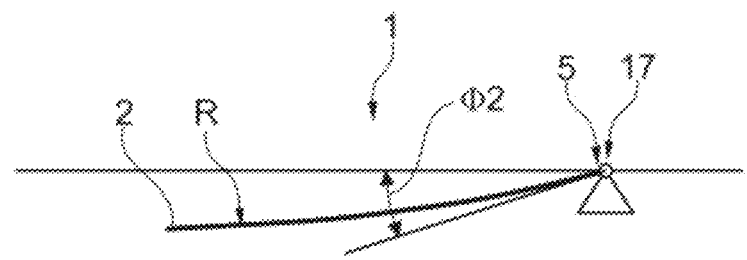

FIG. 3B and FIG. 3C, respectively, show a further enlarged depiction of the deformation of the piezo bending transducer 2 according to FIG. 3A at the central bearing region 16 (FIG. 3B) and the lateral bearing region 17 (FIG. 3C) to illustrate the twists φ1 and φ2. During operation, they usually move in a range of +/−2 degrees.

Figure 4A:
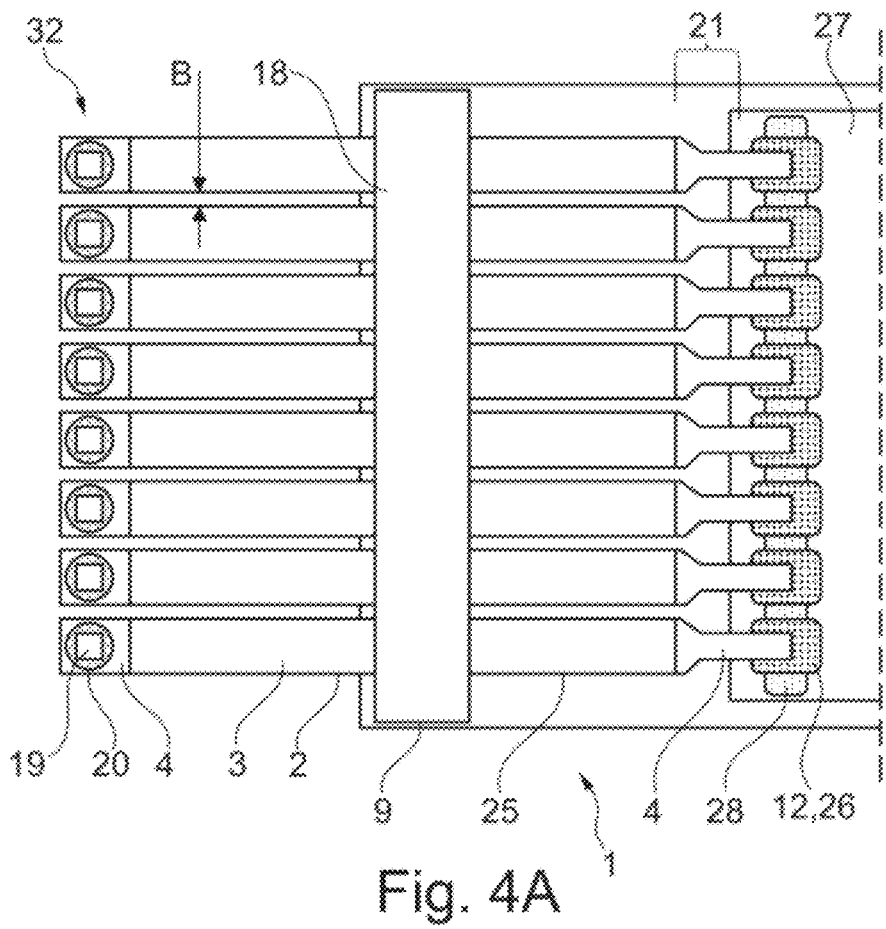
FIG. 4A is a top view of an embodiment for a piezo actuator array composed of piezo actuators.
Figure 4B:
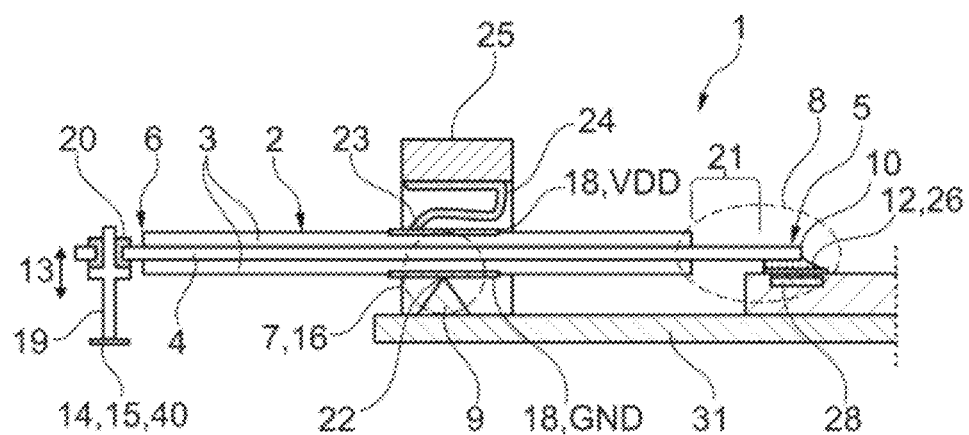
FIG. 4B is a lateral section of an embodiment for a piezo actuator array composed of piezo actuators.

By way of example, FIGS. 4A and 4B show an embodiment of a piezo actuator array 32 with bimorphic piezo actuators 2 mounted in accordance with the second bearing type LA2 and in the configuration according to FIGS. 2A and 3A. In this case, the centrally located bearing region 16 corresponds to the first bearing region 7, shown in dashed lines in FIG. 4B, with a support 9 as a pivot bearing, and the laterally located bearing region 17 corresponds to the second bearing region 8 for carrying out an actuating movement 13 at the movable end 6 of the piezo bending transducer 2. At the movable end 6 shown on the left, effectors 19 are located which have the actuation point 14 at their tip. The effectors 19 are preferably connected to the piezo bending transducer 2 via an elastic connection 20 which in this case can be, for example, an elastomeric intermediate piece or an elastic adhesive bond. The elastic connection 20 reduces the transmission of impacts from the actuation point 14 to the piezo bending transducer 2 and simultaneously offers a certain rotation tolerance for the effector 19.

In the embodiment, the application of the bias torque 34 takes place by means of a pressure element 24 in the form of tongue-like structured and optionally curved pressure spring strips or arrays 24, which is located below a retaining bridge 25. The springs can have any meaningful shape but are shaped such that they exert a force F on the individual piezo bending transducers 2 exactly at the contact points 23. For this purpose, they can optionally each have a separate pressure element.

The electrical contacting of the piezo bending transducers 2 requires the contacting of all piezo lamellas 3 on the upper side, for example, with an operating voltage VDD of 100V [volts] to 200V and on the underside with ground (GND). This is done on the upper side and on the underside with one or more connected connecting electrodes 18 which run transversely to the piezo bending transducers 2 and are applied, for example, as contact strips or contact wires made of copper, brass, nickel, or thin, flexible circuit carrier material by soldering or gluing under pressure during the manufacture of the piezo actuator arrays 32.

The second bearing region 8, which contains the intermediate layer 12, is located at the immovable (right) end 5 of the piezo bending transducer 2. An embodiment is shown in which a carrier layer 4 consists of a solderable material such as nickel, copper, or brass. The second bearing region 8 thus comprises a region of the carrier layer 4 which is not covered with piezo lamellas 3 and which represents an elastic region 21 of the second bearing region 8. Due to a small thickness of the carrier layer 4 of, for example, 30 μm to 100 μm, a sufficient bending elasticity can thus already be present to make a bending line as in FIG. 3A possible. FIG. 4A shows that the carrier layer 4 is designed to be narrower in the elastic region 21, which leads to a reduction in the bending forces in the elastic region 21.

In the embodiment in FIGS. 4A and 4B, the surface 10 of the second bearing region 8 on the side of the bending transducer is thus a lateral surface of the carrier layer 4 of the piezo bending transducer 2, which is not covered with piezo lamellas 3. The intermediate layer 12 consists of a low-melting solder and the surface 11 of the second bearing region 8 on the side of the housing is a contact pad 26 of a circuit board 27. The latter is preferably made of ceramic as shown in FIGS. 4A and 4B, or of a very high Tg circuit board material. A (thick-film) heating element 28, separated only by an electrical insulating layer, is then preferably located directly below all contact pads 26 of the piezo bending transducer 2. In this configuration, there is direct thermal contact with the intermediate layer 12, so that it can be melted within seconds.

Figure 5:
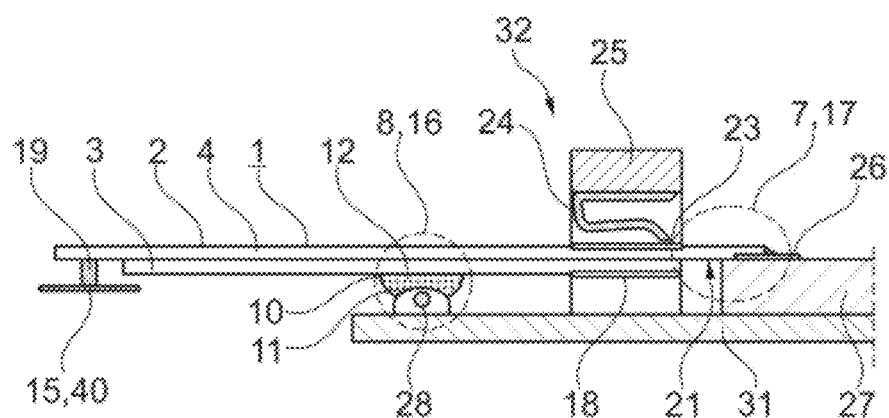
FIG. 5 shows a lateral section of a further embodiment for a piezo actuator array composed of piezo actuators.

FIG. 5 shows an example of a lateral section of an embodiment for a piezo actuator array 32 with monomorphic piezo actuators 1 having piezo bending transducers 2 with a piezo lamella 3 underneath, mounted in accordance with the second bearing type LA2 and in the configuration according to FIGS. 2B and 3A. In this case, the centrally located bearing region 16 corresponds to the second bearing region 8, shown in dashed lines, and the laterally located bearing region 17 corresponds to the first bearing region 7, shown in dashed lines. The latter is realized by firmly soldering the carrier layer 4 to the contact of a circuit board 27. As in FIGS. 4A and 4B, the elasticity of the present first bearing region 7 is represented by the carrier layer in region 21. The second bearing region 8 is located in the center of the piezo bending transducer 2. Said second bearing region is formed by an elastic, fusible intermediate layer 12 which has good adhesion to the piezo bending transducer 2. A heating wire 28 running transversely to all piezo bending transducers 2 within an insulating support structure is suitable for melting the intermediate layer 12 directly from the inside. In this configuration, the pressure element 24 in the form of a pressure spring array 24 for applying the bias torques 34 around the first bearing regions 7 is located on the right-hand side of the drawing.

Figure 6A:
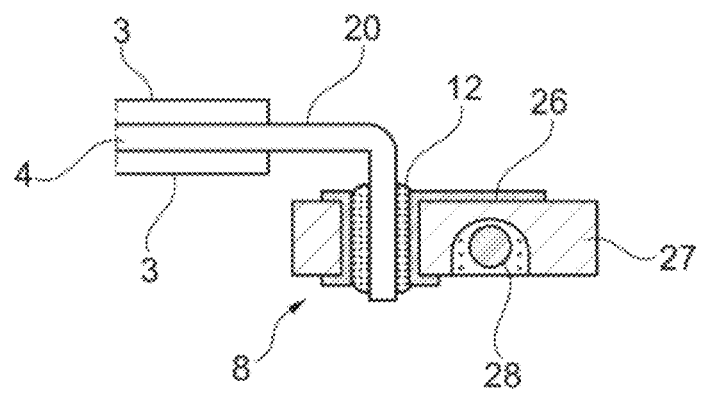
FIGS. 6A and 6B show further embodiments for second bearing regions.

FIG. 6A shows a variant of a second bearing region 8 in which the outermost part of the carrier layer 4 is bent and protrudes through a through-connection in a circuit board 27. The intermediate layer 12 corresponds to the solder in the through-connection. In addition, a heater 28 is located in a groove at the bottom of the circuit board.

Figure 6B:
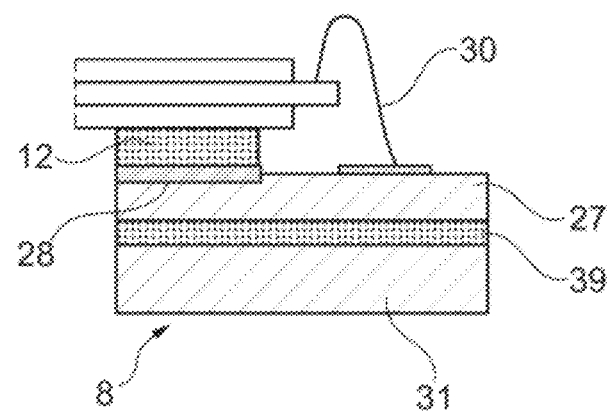

FIG. 6B shows a variant of a second bearing region 8 with a fusible elastomer or an elastic adhesive as an intermediate layer 12 on the circuit board 27. It is heated by a heating layer 28 located directly below the intermediate layer 12 in direct thermal contact. Also shown is an insulating layer 39 between circuit board 27 and housing 31.

The production of the piezo actuator arrays 32 takes place in the panel. A multiplicity of, for example, 16, 32 or 64 piezo lamellas 3 are each manufactured using sawing processes on sawing foils and/or pre-structured bending transducer carrier layers and/or micro-effectors from a plate of the respective material in the panel, i.e., manufactured such that they each form a coherent part. They are then joined together in the panel to form a monomorph or bimorph piezo bending transducer array 32 and molded or glued in the panel with connected elastic contact electrodes and molded or glued in the panel with the micro-effectors. Alternatively, the piezo lamellas 3 and the pre-structured piezo bending transducer support structures can first be glued to one another and only in the second step be sawed in the panel on sawing foil in order to be further processed in the panel.

The method includes the step of producing one or more panel piezo actuator arrays 32 from a multiplicity of piezo bending transducers 2 according to the invention which are arranged side by side and form a cohesive structure, inserting said structure into a print head or coating head, and finally performing an alignment process according to the invention in which all piezo actuators are aligned at their reference positions 40. The method is also characterized in that no further alignments have to be made.

A piezo actuator 1 for carrying out an actuating movement 13 is disclosed with a piezo bending transducer 2 made of a carrier layer 4 which is at least partially covered on one or two sides with a piezo lamella 3, with a movable end 6 and with a housing 31, with a reference stop 15 connected to the housing 31 for determining a reference position 40 for the actuating movement 13, with a first bearing region 7 which comprises regions of the piezo actuator 1 and the housing 31 and which allows for twists φ1 of the piezo bending transducer 2, with a second bearing region 8 having a surface 10 on the side of the bending transducer and a surface 11 on the side of the housing, and an intermediate layer 12 between the surfaces, which connects them and which can be liquefied, and with a pressure element 24 for generating a bias torque 34 on the piezo bending transducer 2 around the first bearing region 7 against the reference stop 15.

I claim:

1. A piezo actuator comprising:
    a piezo bending transducer comprising a carrier layer which is at least partially covered on one or two sides with one or more piezo lamellas, the piezo bending transducer further comprising a movable end;
    a housing;
    a reference stop connected to the housing for determining a reference position for an actuating movement;
    a first bearing region which comprises regions of the piezo actuator and the housing and which allows for twists of the piezo bending transducer;
    a second bearing region with a surface on the side of the bending transducer and a surface on the side of the housing, and an intermediate layer between the surface on the side of the bending transducer and the surface on the side of the housing, wherein the intermediate layer connects the surface on the side of the bending transducer and the surface on the side of the housing, wherein the intermediate layer has a liquefaction temperature at which it liquefies; and
    a pressure element for generating a bias torque on the piezo bending transducer near the first bearing region against the reference stop;
    wherein the piezo actuator is operable between an operating mode and an alignment mode:
        wherein when the piezo bending transducer carries out actuating movements in the operating mode, the temperature of the intermediate layer is below the liquefaction temperature and the intermediate layer is sufficiently firm to transfer the bearing forces in the second bearing region,
        wherein, in the alignment mode, the piezo bending transducer is aligned with the reference stop and the temperature of the intermediate layer is above the liquefaction temperature due to a supply of heat; and
        wherein the supply of heat is provided by one of an external heat source and an integrated heating element in thermal contact with the second bearing region.

2. A piezo actuator according to claim 1, wherein the heating element is controlled by a process controller adapted to control the heat output and heating time of the heating element such that the temperature in the second bearing region is raised above the liquefaction temperature of the intermediate layer, and such that the intermediate layer is liquified for a period of time between 1 second and 100 seconds.

3. A piezo actuator according to claim 1, wherein the intermediate layer comprises a solder with a liquefaction temperature below of 250° C. or less, wherein the solder is in electrical contact with one of the carrier layer and an electrode of the piezo lamella.

4. A piezo actuator according to claim 1, wherein the intermediate layer comprises one of a thermoplastic material, a thermoplastic elastomer, a bitumen, or a wax, having a liquefaction temperature of 250° C. or less.

5. A piezo actuator according to claim 1, wherein the piezo bending transducer is adapted to receive a bias torque near the first bearing region, wherein upon application of the bias torque the movable end of the piezo bending transducer, or an effector connected thereto, is pressed against the reference stop.

6. A piezo actuator according to claim 5, wherein
    the piezo bending transducer has clamping force of magnitude ($F_K$);
    the first bearing region is located a distance ($L_R$) from an actuation point of the piezo bending transducer;
    the bias torque is a force of magnitude (F) applied to the piezo bending transducer by the pressure element at a contact point;
    the contact point is located on the piezo bending transducer at a distance (x) from the pivot point of the first bearing region; and
    the relationship between (F), (x), ($F_K$), and ($L_R$) is $(F)*(x) < 0.5*(F_K)*(L_R)$.

7. A piezo actuator according to claim 1, wherein the piezo bending transducer is of monomorphical construction with one piezo lamella glued to the carrier layer, wherein the one piezo lamella covers the carrier layer predominantly in the region of a free length of the piezo bending transducer, or the one piezo lamella covers the carrier layer substantially completely.

8. A piezo actuator according to claim 1, wherein the piezo bending transducer is of bimorphical construction with two piezo lamellas each glued to either side of the carrier layer, wherein the two piezo lamellas cover the carrier layer predominantly in the region of a free length of the piezo bending transducer, or the two piezo lamellas cover the carrier layer substantially completely.

9. A piezo actuator according to claim 1, wherein the pressure element comprises a spring.

10. A piezo actuator according to claim 9, wherein the pressure element is selected from metallic spiral springs, flexion springs, electrical contact springs, and combinations thereof.

11. A piezo actuator according to claim 1, wherein the pressure element comprises an elastomer element.

12. A method for aligning a piezo actuator in accordance with claim 1, the method comprising the following steps:
 a) providing a piezo actuator in accordance with claim 1;
 b) liquifying the intermediate layer by applying heat to the second bearing region;
 c) aligning the piezo bending transducer against the reference stop by the application of the bias torque to the piezo bending transducer for an alignment time ($T_A$);
 d) solidifying the intermediate layer by cooling the second bearing region for a cooling time ($T_K$).

13. The method for aligning a piezo actuator according to claim 12, wherein the liquifying step further comprises the application of electricity to the piezo bending transducer.

14. The method for aligning a piezo actuator according to claim 13, wherein the voltage of the electricity applied to the piezo bending transducer is adjusted in response to deformation of the piezo bending transducer resulting from application of the bias torque.

15. The method for aligning a piezo actuator according to claim 13, wherein, the voltage of the electricity applied to the piezo bending transducer is different from the voltage applied during the liquefying step of a preceding alignment cycle.

* * * * *